United States Patent
Daniel et al.

[19]

[11] Patent Number: 6,157,681
[45] Date of Patent: Dec. 5, 2000

[54] TRANSMITTER SYSTEM AND METHOD OF OPERATION THEREFOR

[75] Inventors: Brian Michael Daniel; Kenneth Maynard Peterson, both of Phoenix; William George Schmidt, Sun Lakes, all of Ariz.

[73] Assignee: Motorola, Inc., Schaumburg, Ill.

[21] Appl. No.: 09/055,395

[22] Filed: Apr. 6, 1998

[51] Int. Cl.$^7$ .......................... H04L 27/36; H04L 27/04; H03C 7/02; H04B 1/02

[52] U.S. Cl. .......................... 375/298; 375/299; 455/101; 455/102

[58] Field of Search .................... 375/299, 298, 375/267, 268, 279, 260, 261, 300, 302, 308; 455/101, 102, 103, 42, 500

[56] References Cited

U.S. PATENT DOCUMENTS

| | | | |
|---|---|---|---|
| 5,649,287 | 7/1997 | Forssen et al. | 370/312 |
| 5,832,044 | 11/1998 | Sousa et al. | 375/347 |
| 5,909,460 | 6/1999 | Dent | 375/347 |

*Primary Examiner*—Stephen Chin
*Assistant Examiner*—Albert Park
*Attorney, Agent, or Firm*—Sherry J. Whitney; Timothy J. Lorenz; Frank J. Bogacz

[57] ABSTRACT

A transmitter system (18) which transmits a communication signal (14) through a phased-array antenna (10) uses a signal processor (26) and a multiplicity of direct modulators (30). Each direct modulator (30) drives a single element (12) of the antenna (10). Each direct modulator (30) receives a digital baseband phase point data signal (62) from a digital data stream (28). The digital data stream (28) also conveys digital beam formation data (60). Each direct modulator (30) digitally combines the baseband phase point data (62) with the beam formation data (60) to produce digital streams that modulate an RF carrier signal (34). The digital data stream (28) is generated by a phased-array signal processor (26) which processes user data bits (86) received from any number of input signals (22) and processes beam signals (24). In one embodiment, the signal processor (26) calculates phase point data (62) representative of all input signals (22).

18 Claims, 6 Drawing Sheets

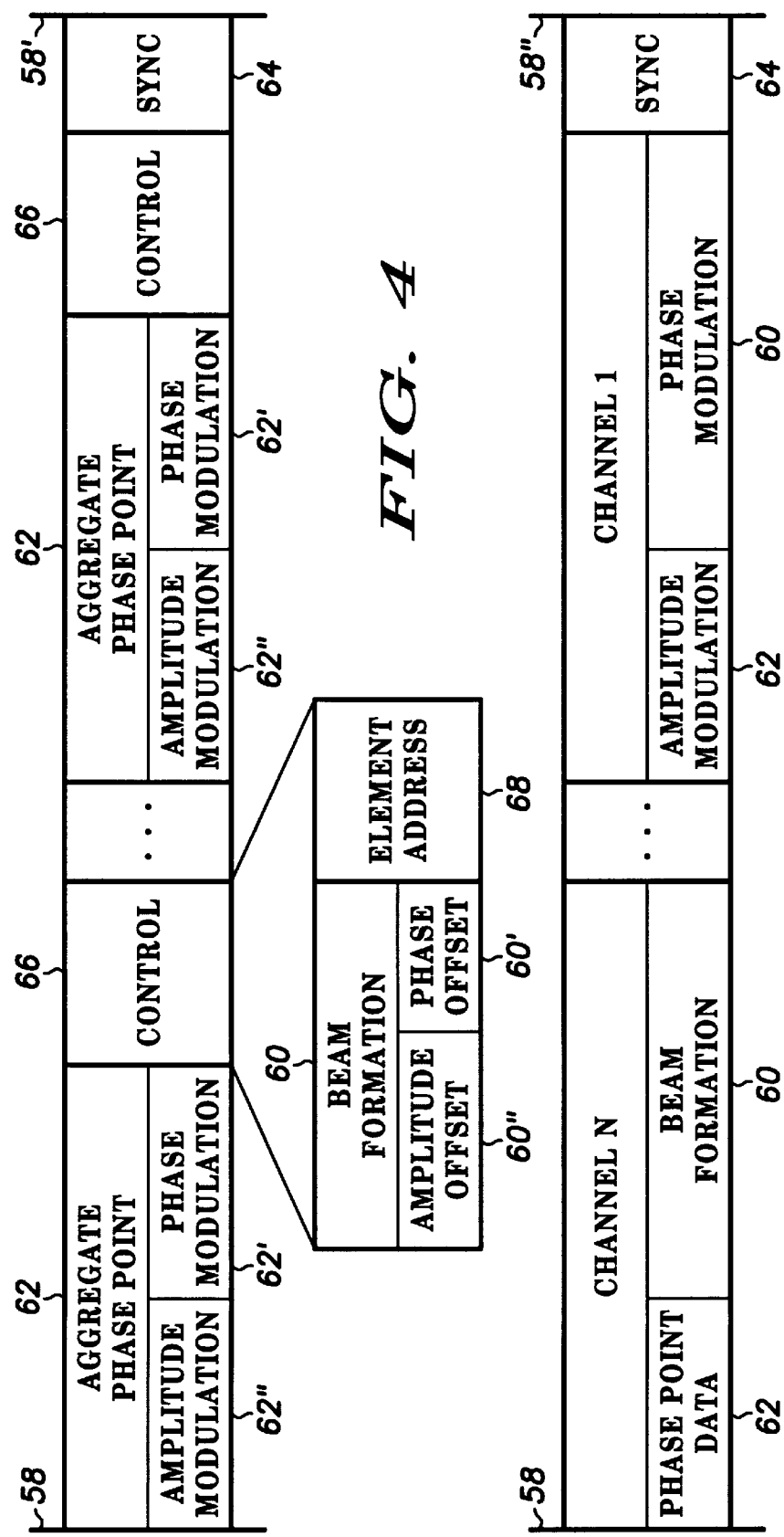

TRANSMITTER SYSTEM AND METHOD OF OPERATION THEREFOR

FIELD OF THE INVENTION

The present invention relates generally to RF communications and to array antenna transmitting devices. More specifically, the present invention relates to array antennas where different radiating elements are driven by different individual transmitters.

BACKGROUND OF THE INVENTION

Phased-array and similar antennas generate antenna beams determined by the relative phase and amplitude relationships of signals that excite numerous antenna elements arranged in an array. Adjustable phase shifters and amplitude adjusters are often used in combination with a beamforming network, such as a Butler matrix or the like, and a corporate feed network to control the collective antenna beam formed from numerous beamlets associated with the numerous antenna elements. The adjustable phase shifters permit electronic steering of the antenna beam.

In a typical arrangement used in the communication of digital signals, a digital input signal is converted into an analog baseband signal that is mixed with an intermediate frequency (IF) signal, amplified, mixed with a radio frequency (RF) signal, and then amplified again to produce a communication signal. The communication signal excites one or more antenna elements after being routed through a corporate feed network that may include one or more beamforming networks. However, this arrangement leads to undesirable effects which are related to the use of an analog baseband signal.

The analog baseband signal must be processed through numerous devices before the resulting communication signal is formed. The use of a greater number of devices to perform a function which may otherwise be accomplished with fewer devices is undesirable because it usually imposes power consumption, reliability, weight, and system complexity penalties. The use of linear analog amplifiers necessitated by the use of an analog baseband signal causes conventional techniques to exhibit a particularly poor power efficiency parameter.

In addition, the use of analog baseband signals excessively complicates the layouts of feed networks that drive array antennas. In a conventional arrangement, a large number of communication signals are generated and propagated through the feed network to a large number of antenna elements. The parallel propagation of numerous communication signals takes place while preserving relative phase relationships between the numerous communication signals. The constraint of routing numerous transmission lines while maintaining relative phase relationships imposes a severe burden upon the geometry and layout of an array antenna.

The layout burden is exceptionally severe when imposed upon beamforming networks. As the frequencies at which RF communications take place increase, the array antenna geometry shrinks. This forces the layout constraints to be observed in smaller and smaller areas. Due to layout constraints, array antennas and associated beamforming networks for large numbers of elements become impractical when designed using conventional techniques for operation at higher frequencies.

Accordingly, a need exists for an array antenna transmitting apparatus that is not driven by a conventional analog baseband input signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 4 shows a first exemplary embodiment of a frame employed by a digital data stream generated by a phased-array signal processing computer portion of the transmitting apparatus shown in FIG. 2;

FIG. 5 shows a second exemplary embodiment of a frame employed by the digital data stream generated by the phased-array signal processing computer;

DETAILED DESCRIPTION OF THE DRAWINGS

Figure 1:
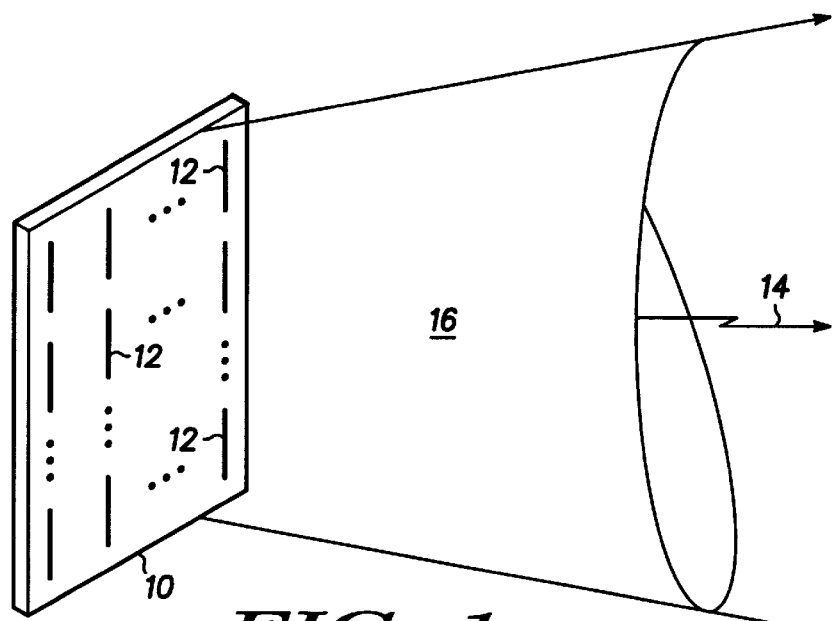
FIG. 1 shows a perspective view of an exemplary phased-array antenna configured in accordance with the teaching of the present invention.

FIG. 1 shows a perspective view of an exemplary phased-array antenna 10. Antenna 10 includes a multiplicity of radiating elements 12 arranged in a predetermined array pattern. The precise number of elements 12 used by antenna 10 is not an important feature of the present invention, but may range from only a few to the hundreds or even thousands. Antenna 10 is desirably, but not necessarily, formed using conventional printed circuit, microstrip, or stripline techniques.

When a communication signal 14 is transmitted through phased-array antenna 10, the electrical field strength of communication signal 14 has a geometrical pattern in space referred to herein as a beam 16. Beam 16 represents the composite of numerous beamlets (not shown), where each beamlet results from a communication signal component (not shown) radiated from a single element 12. Accordingly, communication signal 14 is collectively formed from communication signal components simultaneously transmitted from individual elements 12. In a manner known to those skilled in the art, the relative phase and amplitude relationships of the communication signal components determine the shape and direction of beam 16. Beam 16 is electronically steered by varying these phase and amplitude relationships.

While different communication signal components typically exhibit different phase and amplitude relationships, all communication signal components are nevertheless related to an underlying common RF carrier signal. In the preferred embodiment, communication signal 14 is a digital communication signal in which digital data are conveyed through phase and amplitude variations in the radio frequency (RF) carrier signal. In accordance with the teaching of the present invention, the phase and amplitude relationships of the communication signal components are simultaneously controlled to achieve two distinct goals. One goal is the communication of digital data, and the other goal is the formation of beam 16.

Figure 2:
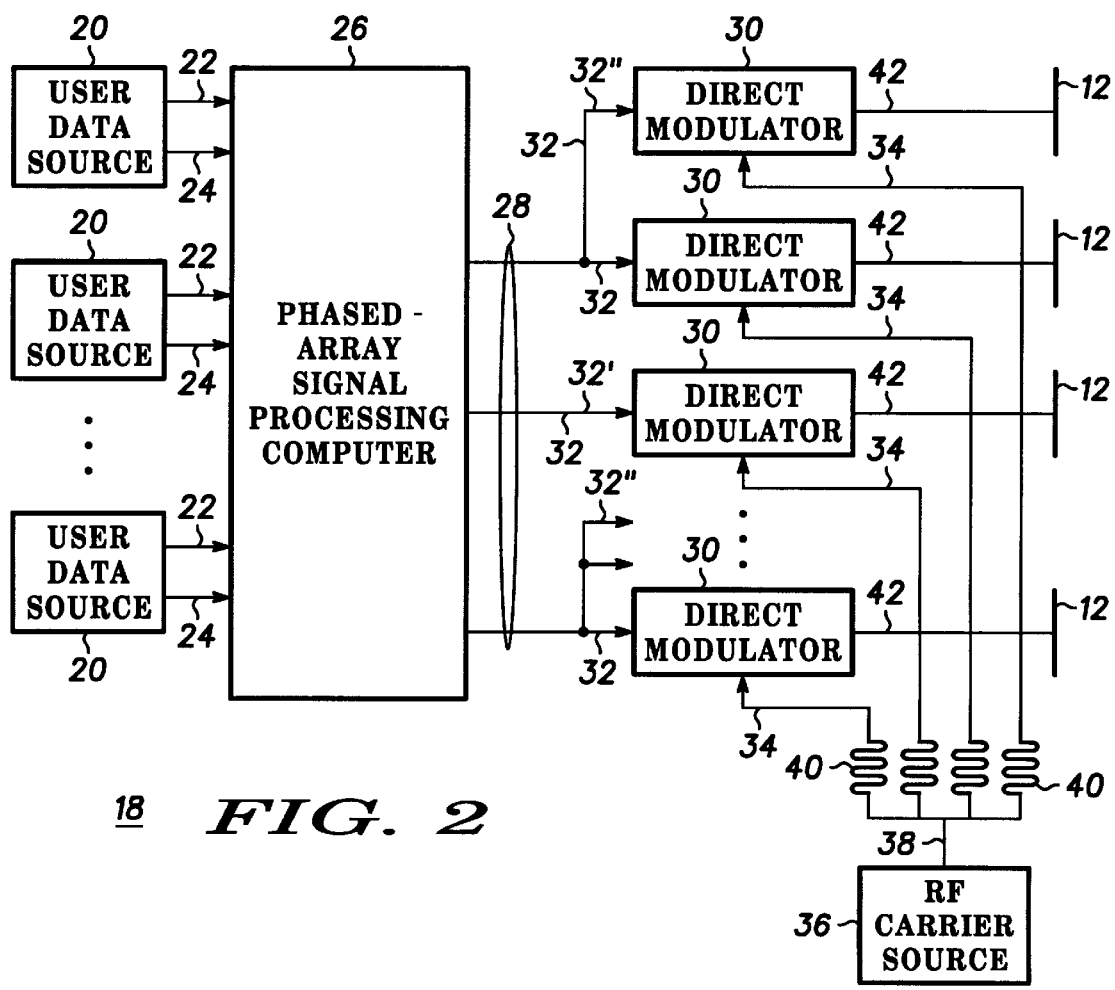
FIG. 2 shows a block diagram of an array antenna transmitting apparatus configured in accordance with the teaching of the present invention.

FIG. 2 shows a block diagram of an array antenna communication apparatus 18 configured in accordance with the teaching of the present invention. Transmitting apparatus 18 includes any number of user data sources 20. Each source 20 represents a single channel, and the channels are independent of one another. Each source 20 provides a digital input signal 22 and beamlet information 24. Each digital input signal 22 conveys a stream of user data bits. The symbol rates of the digital input signals 22 could be the same or different.

All digital input signals 22 and beamlet information 24 are received at a phased array signal processing computer 26. Computer 26 processes signals 22 and information 24 in real time to generate a digital data stream 28. Computer 26 is discussed in more detail below in connection with FIGS. 6–8. Data stream 28 conveys two distinct types of information. One type of information is contained in a baseband digital signal into which the user data bits from input signals 22 have been transformed. This type of information is called phase point data herein and is discussed in greater detail below. Another type of information is beam formation offset data, which is also discussed in greater detail below.

Digital data stream 28 is routed to each of any number of direct modulators 30. In the preferred embodiment, each direct modulator 30 drives a single radiating element 12 so that the number of direct modulators 30 equals the number of antenna elements 12 in antenna 10. However, those skilled in the art can alternatively devise applications where each direct modulator 30 drives a plurality of elements 12.

Digital data stream 28 is routed to direct modulators 30 over data busses 32. Data busses 32 are configured as required to distribute the phase point data and beam formation offset data to direct modulators 30 in real time. Different applications will suggest different architectures for busses 32. For example, in a TDM application where a single highly focused beam 16 (FIG. 1) is rapidly hopped or steered between different receivers (not shown), a large quantity of beam formation offset data may be required to effect continuously changing beam formation configurations. In this application, a single bus 32' may be associated with each direct modulator 30, and a multiplicity of such single busses 32' (only one shown) operated in parallel to transfer the required amount of data to all direct modulators 30 from computer 26 in real time.

In a continuous beam application where beam 16 includes several continuously active but perhaps less focused sub-beams, a relatively small quantity of beam formation offset data may be required to maintain the configuration of beam 16. In this application, a single bus 32" may be associated with a plurality or perhaps even all of direct modulators 30.

Each direct modulator 30 receives a common RF carrier signal 34 from an RF carrier source 36. Signals 34 are routed through a corporate feed network 38 in which various length equalization sections 40 are provided as needed so that no substantial carrier phase difference appears at the RF carrier signal 34 inputs to the different direct modulators 30.

Generally, each direct modulator 30 receives various phase and amplitude values from digital data stream 28. The phase values convey rapidly updated phase point phase modulation data and typically less rapidly updated beam formation phase offset data. The phase values also convey rapidly updated phase point amplitude modulation data and typically less rapidly updated beam formation amplitude offset data. All direct modulators 30 receive the same phase point phase and amplitude data, but different direct modulators 30 receive different beam formation phase and amplitude offset data.

In response to the information conveyed by digital data stream 28, each direct modulator 30 generates a communication signal component 42. Each communication signal component 42 results from simultaneously and independently performing beamforming and modulation operations within its associated direct modulator 30. Consequently, beam forming and modulation for communication signal components 42 which drive elements 12 of antenna 10 (FIG. 1) occur in a distributed manner across all direct modulators 30.

Figure 3:
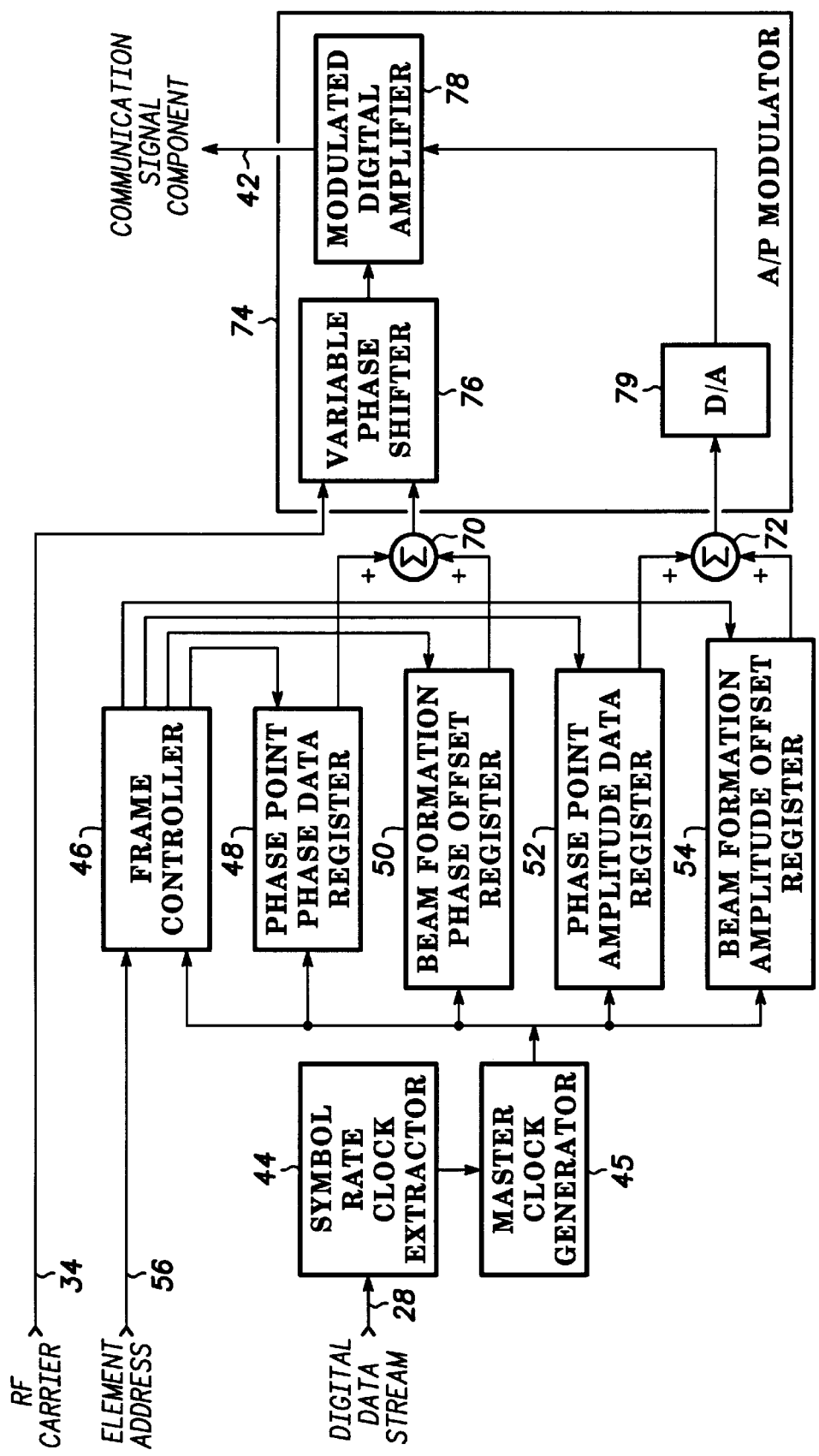
FIG. 3 shows a block diagram of a direct modulator portion of the transmitting apparatus shown in FIG. 2.

FIG. 3 shows a block diagram of direct modulator 30. In the preferred embodiment, direct modulators 30 are identical to one another. Accordingly, cost efficiencies are achieved by using a common component in high volume. Direct modulator 30 receives digital data stream 28 from bus 32 (FIG. 2) at a symbol rate clock extractor 44. Extractor 44 extracts a symbol rate clock from digital data stream 28 in a conventional manner and passes digital data stream 28 on to inputs of a frame controller 46 and to inputs of registers 48, 50, 52, and 54. Register 48 obtains and holds phase point phase values from data stream 28. Register 50 obtains and holds beam formation phase offset values from data stream 28. Register 52 obtains and holds phase point amplitude values from data stream 28, and register 54 obtains and holds beam formation amplitude offset values from data stream 28.

The master clock generator 45, which has a rate related to a highest symbol rate, is used throughout direct modulator 30 to control pipe-lining and to generally maintain synchronization of data. All direct modulators should extract substantially the same clock rate. Hence, all direct modulators 30 operate synchronously with one another, and communication signal components 42 have substantially equivalent timing.

An input of frame controller 46 is adapted to receive an element address 56. Element address 56 is configured to uniquely identify a direct modulator 30 and its associated antenna element 12 (FIGS. 1–2) within phased-array antenna 10 (FIG. 1). Element address 56 may be provided by a hard-wire connection to direct modulator 30. Outputs of frame controller 46 couple to enabling inputs of registers 48, 50, 52, and 54.

FIG. 4 shows a first exemplary embodiment of a frame 58' employed by digital data stream 28. While digital data stream 28 is generated by phased-array signal processing computer 26 (FIG. 2), frame 58' is discussed here to illustrate how frame controller 46 operates in cooperation with registers 48, 50, 52, and 54. Frame 58' is suitable for applications where beam formation phase and amplitude offset values 60' and 60", respectively, are updated much less frequently than aggregate phase point phase and amplitude modulation values 62' and 62", respectively. Such applications may arise when beam 16 (FIG. 1) includes several individual sub-beams that are continuously active.

Generally, frame 58' extends over a duration for which a given beam formation definition for antenna 10 (FIG. 1) remains stable. Throughout frame 58', phase point data 62' and 62", herein collectively referred to as phase point data 62, change from unit interval to unit interval. A unit interval of time is required by communication apparatus 18 (FIG. 2) to communicate a single phase point. The unit interval represents the reciprocal of the symbol rate. Over each unit interval, the relative phase and amplitude of quadrature components of digital communication signal 14 (FIG. 1) transitions from one set of phase/amplitude data (i.e. one phase point) to another. Accordingly, frame 58' encompasses numerous unit intervals.

Phase point data 62 represent a digital baseband signal within data stream 28. This digital baseband signal is transmitted and provided in digital data stream 28 at the symbol rate. Frame 58' also includes a single sync pattern 64 located at a predetermined position, such as the beginning, of frame 58' and any number of control slots 66. FIG. 4 illustrates control slots 66 as being interleaved with phase point data 62.

Referring to FIGS. 3 and 4, frame controller 46 identifies occurrences of phase point phase modulation values 62' within data stream 28 and causes values 62' to be captured by register 48. Likewise, frame controller 46 determines when phase point amplitude modulation values 62" occur within data stream 28 and causes values 62" to be captured by register 52. Throughout communication apparatus 18 (FIG. 2), all direct modulators 30 capture phase point data 62 in a like manner. Accordingly, all direct modulators 30 are responsive to all phase point data 62.

In this embodiment, each control slot 66 includes an element address 68 and beam formation phase and amplitude offset values 60' and 60", hereinafter collectively referred to as beam formation data 60. Beam formation data 60 are addressed to the unique direct modulator 30 identified by the corresponding element address 68. Frame controller 46 identifies occurrences of control slots 66 which contain element addresses 68 that correspond to the direct modulator element address 56. When such control slots are found, frame controller 46 causes the corresponding beam formation phase offset values 60' to be captured by register 50 and the corresponding beam formation amplitude offset values 60" to be captured by register 54. Accordingly, each direct modulator 30 captures only a portion of the beam formation data 60 included in data stream 28, that portion being the specific beam formation data 60 addressed to it.

While FIG. 4 illustrates the inclusion of element addresses 68 in control slots 66, those skilled in the art will appreciate that an alternate embodiment may identify a control slot addressed to a particular element by counting control slots 66, starting with the first control slot following sync pattern 64.

In this embodiment, control slots 66 are arranged within frame 58' so that all direct modulators 30 are updated with their next beam formation data 60 over the course of a frame 58'. Registers 50 and 54 may be configured as double buffered registers, FIFO memories, or the like. Upon detection of a new frame 58', as indicated by detection of sync pattern 64 (FIG. 4) in frame controller 46, new beam formation data 60 are presented at outputs of registers 50 and 54. Accordingly, beam formation data 60 are updated at the frame rate (i.e. the rate at which frames 58' occur in data stream 28). All direct modulators 30 form an updated beam 16 (FIG. 1) substantially simultaneously in response to beam formation data 60 output from registers 50 and 54.

FIG. 5 shows a second exemplary embodiment of a frame 58" employed by digital data stream 28. Frame 58" is suitable for applications where beam formation data 60 and phase point data 62 are both updated frequently. Such applications may arise when beam 16 (FIG. 1) is a highly focused beam that is rapidly hopped around different receiver locations. In frame 58" beam formation data 60 are associated with phase point data 62 in a one to one correspondence. Since more data is being supplied to each direct modulator 30 over a given period of time than occurs in frame 58' (FIG. 4), dedicated busses 32' (FIG. 2) may be used to deliver frames 58". Frame controller 46 causes beam formation data 60 to be captured by registers 50 and 54 and phase point data 62 to be captured by registers 48 and 52 as discussed above. However, in this embodiment element addressing 56 (FIG. 3) may be omitted when dedicated bus 32' is associated with each direct modulator 30.

Frame 58" permits beam 16 to be reformed at a rapid rate. Frame 58" indicates a complete cycle through all the diverse beam configurations defined for the diverse receiver locations. Each set of beam formation data 60 may be associated with a single channel or single receiver location. While FIG. 5 indicates a single time slot for phase point data 62, those skilled in the art will appreciate that this single time slot may convey sufficient phase point data 62 for any number of unit intervals that may be associated with each channel.

While FIGS. 4 and 5 illustrate two embodiments of frames 58' and 58", those skilled in the art will appreciate that these and numerous other frame definitions, hereinafter collectively referred to as frames 58, can be adapted to accommodate a wide range of phased-array antenna applications.

Referring back to FIG. 3, outputs of phase value registers 48 and 50 couple to respective inputs of a phase value combination circuit 70. Likewise, outputs of amplitude value registers 52 and 54 couple to respective inputs of an amplitude value combination circuit 72. Combination circuits 70 and 72 may be implemented using adders. An output of phase combination circuit 70 provides an element-specific phase value stream and output from amplitude combination circuit 72 provides an element-specific amplitude value stream. While phase point data 62 (FIGS. 4–5) provided to each direct modulator 30 in communication apparatus 18 may be identical, beam formation data 60 (FIGS. 4–5) is different for different direct modulators 30. Consequently, after combination of phase values and amplitude values in combination circuits 70 and 72, respectively, the resultant data streams are uniquely adapted for each antenna element 12 (FIGS. 1–2).

The element-specific phase and amplitude value streams are provided to an amplitude-phase (A-P) modulator 74 along with RF carrier signal 34. Modulator 74 resembles a conventional QAM modulator. However, modulator 74 may be configured to operate at a larger number of amplitude-phase states than a typical QAM modulator.

In particular, modulator 74 includes a variable phase shifter 76 which receives RF carrier signal 34 and the element-specific stream of phase values generated by phase combining circuit 70. Phase shifter 76 shifts the phase of RF carrier signal 34 by an amount specified by the current phase value. The element-specific stream of phase values changes at the symbol rate, and these changes incorporate any beam reformation phase offsets which may be required from time-to-time. Accordingly, phase shifter 76 performs phase modulation of RF carrier signal 34. The output of phase shifter 76 is essentially a digital signal in that it conveys only frequency and phase information but no amplitude modulation. The output of phase shifter 76 couples to a signal input of a modulated digital amplifier 78.

A digital-to-analog (D/A) converter 79 receives the element-specific stream of amplitude values generated by phase combining circuit 72. D/A converter 79 has an output that couples to an amplitude control input of modulated amplifier 78. Amplitude values are converted into an analog form by D/A converter 79 and applied to the amplitude control input to introduce amplitude modulation onto the phase modulated signal provided at the signal input of modulated amplifier 78.

An output of modulated amplifier 78 serves as the output of A-P modulator 74, serves as the output of direct modulator 30, and provides communication signal component 42. Communication signal component 42 exhibits approximately the same frequency as RF carrier signal 34. However, the phase parameter of RF carrier signal 34 is modulated in response to the stream of phase values from data stream 28 and the amplitude parameter of RF carrier signal 34 is modulated in response to the stream of amplitude values from data stream 28. A digital baseband signal provides the modulating information and is further processed to incorporate beam formation information. No linear analog amplifiers, intermediate frequency stages or beamformers are required.

Figure 6:
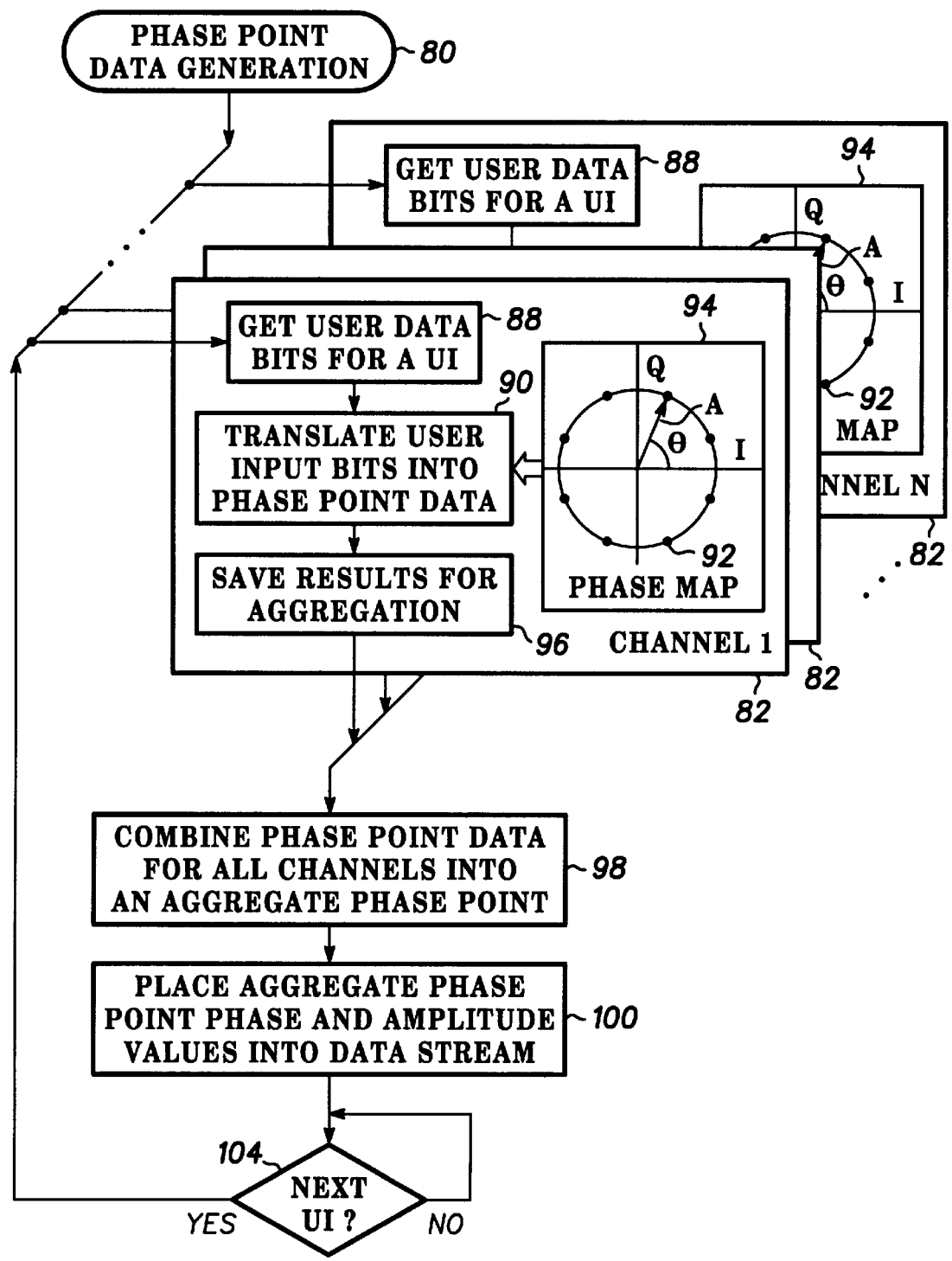
FIG. 6 shows a flow chart of a phase point data generation process performed by the phased-array signal processing computer.

FIG. 6 shows a flow chart of a phase point data generation process 80 performed by phased-array signal processing computer 26 (FIG. 2). Process 80 is performed in a continuous loop, where each iteration through the loop occurs in a unit interval. FIG. 6 illustrates the functionality of process 80 using a flow chart for clarity. However, those skilled in the art will appreciate that process 80 is desirably implemented in hardware to accommodate the timing constraints of performing a single iteration of process 80 for each unit interval. In addition, those skilled in the art will appreciate that pipe-lining techniques may be used so that several unit intervals may be required to process any single user data bit through computer 26. Nevertheless, several stages of the loop can be performed in parallel so that computer 26 processes data in real time at the symbol rate.

In an embodiment of process 80 that is compatible with forming continuous beams for numerous channels as discussed above in connection with FIG. 4, process 80 includes any number of channel sub-processes 82. One sub-process 82 is provided for each user data source 20 in communication apparatus 18 (FIG. 2). Each sub-process 82 is desirably identical to the others, and all sub-processes 82 may be performed in parallel. If only a single channel is to be processed or if only a single channel is to be processed at a time for a beam hopping application as discussed above in connection with FIG. 5, only one sub-process 82 needs to be provided.

Figure 7:
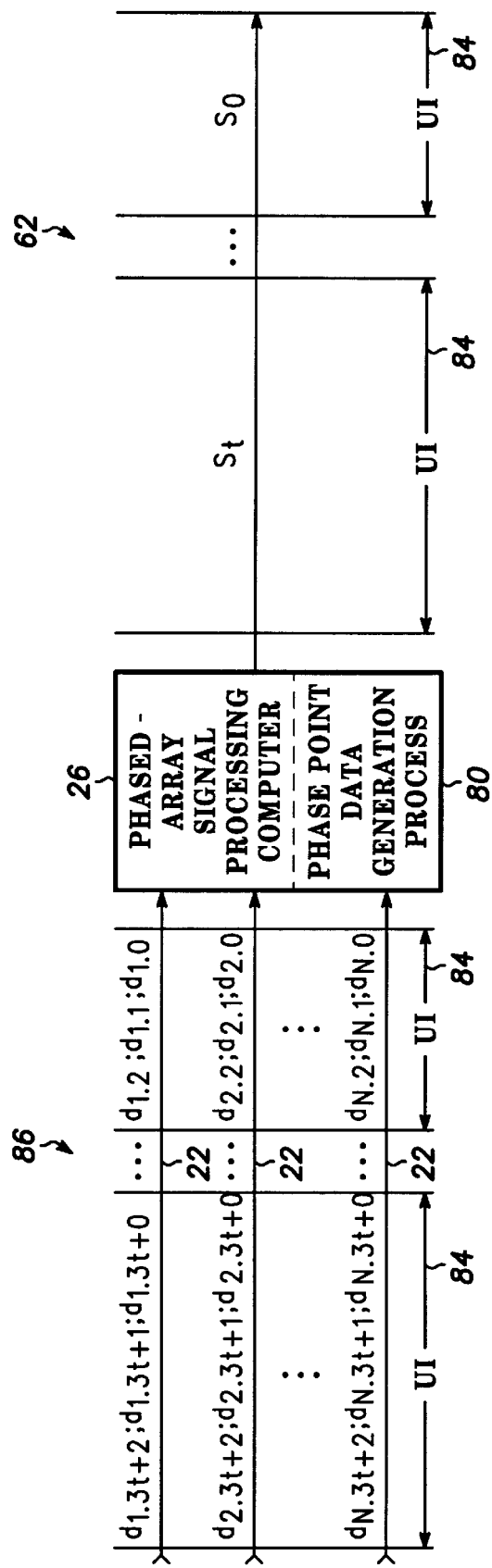
FIG. 7 shows a timing diagram depicting a stream of unit intervals over which user data bits are transmitted by the transmitting apparatus shown in FIG. 2.

FIG. 7 shows a timing diagram depicting a stream of unit intervals (UI) 84 over which user data bits 86 are transmitted by communication apparatus 18. Referring to FIGS. 6 and 7, each sub-process 82 performs a task 88 in which the respective sub-process 82 gets user data bits 86 for a given unit interval 84. Each sub-process 82 gets its user data bits 86 from its respective input signal 22.

Any number of user data bits 86 may be provided to task 88 by a given input signal 22. FIG. 7 illustrates three user data bits 86 per input signal 22 per unit interval 84. This results in a modulation scheme where three bits from each input signal 22 are transmitted from communication apparatus 18 per unit interval 84 (e.g. 8-PSK). However, those skilled in the art will appreciate that the present invention may be used with any modulation scheme which transmits any number of user data bits 86 per unit interval 84. During task 88, each sub-process 82 gets that number of user data bits 86.

After task 88, a task 90 translates the user data bits 86 obtained in task 88 into phase point data 92. Task 90 may utilize a phase map 94 in performing its translation. Phase map 94 is a memory table, and the translation is performed by table look-up. Phase point data 92 describe phase and amplitude values for a carrier signal which will be used to convey the user data bits 86. No beam formation offsets information is provided by task 88. The phase and amplitude values may be described using polar coordinates, as indicated in the equation:

$$\phi(t)=A(t)\cos(\omega_c t+\theta(t)), \qquad \text{EQ.1}$$

where:
$\phi(t)$ is the instantaneous value for a carrier signal,
$A(t)$ is the signal amplitude,
$\omega_c$ is the carrier frequency, and
$\theta(t)$ is the phase.

Likewise, the phase and amplitude values may be described using rectilinear coordinates, as indicated by the variables I and Q in the equivalent equation:

$$\phi(t)=(I(t)\cos(\omega_c t)+Q(t)\sin(\omega_c t)), \qquad \text{EQ.2}$$

where:
$I(t)=A(t)\cos\theta(t)$, and
$Q(t)=A(t)(-\sin\theta(t))$.

For clarity, this description assumes that the polar coordinate version of phase point data is being used, but those skilled in the art will appreciate that equivalent functions can be performed using the rectilinear coordinate version of phase point data.

Following task 90, a task 96 is performed to save the phase point data results obtained in task 90 for use in an aggregation task 98. Task 98 follows task 96 and is performed centrally for all channels or input signals 22. In particular, task 98 combines the phase point data saved in tasks 96 from all sub-processes 82 to generate a single aggregate phase point. Task 98 uses well-known trigonometric identities to compute the equation:

$$\phi_{AGG}(t)=\sum_{m=1}^{N} A_m(t)\cos(\omega_c t+\Delta\omega_m t+\theta_m(t)), \qquad \text{EQ.3}$$

where:
$\phi_{AGG}(t)$ is the instantaneous value for a carrier signal,
$A_m(t)$ is the amplitude for the $m^{th}$ channel,
$\omega_c$ is the carrier frequency,
$\Delta\omega_m$ is the frequency offset for the $m^{th}$ channel, and
$\theta_m(t)$ is the phase for the $m^{th}$ channel.

The frequency offset and carrier frequency are constant values. The amplitude information and phase information are obtained from tasks 96 in sub-processes 82.

Of course, in beam hopping or single channel embodiments, no combination of phase point data is required in task 98.

After task 98, a task 100 places aggregate phase point phase and amplitude values obtained from combination task 98 into data stream 28 for communication to direct modulators 30 (FIG. 2). The aggregate phase point values are denoted as symbols (S) 62 in FIG. 7. One symbol is generated for each unit interval 84. Following task 100, a query task 104 is performed to insure synchronization with unit intervals 84. When the next unit interval 84 occurs, program flow proceeds to sub-processes 82 to process another unit interval 84 of user data bits 86 and generate another symbol 62.

Figure 8:
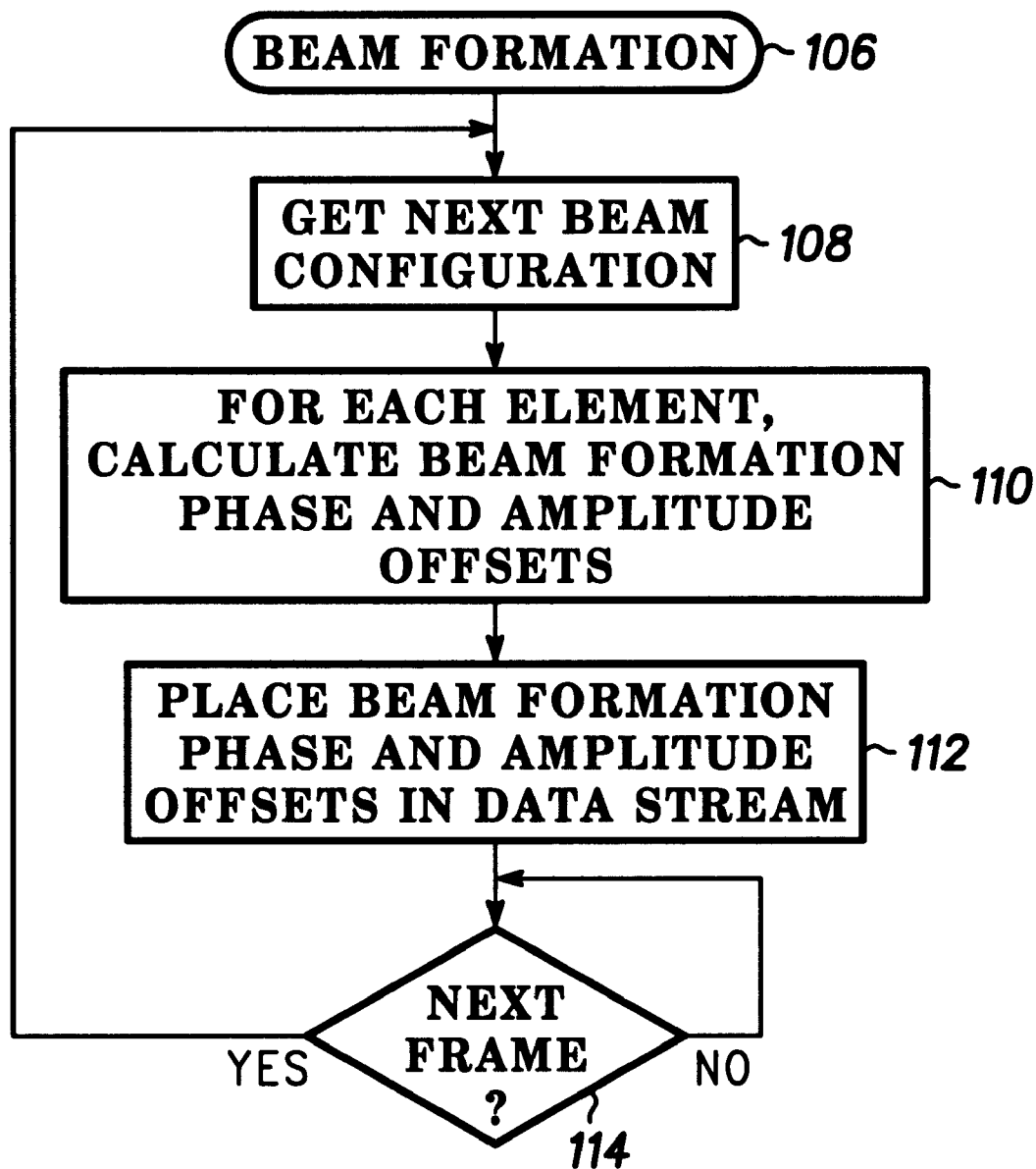
FIG. 8 shows a flow chart of a beam formation process performed by the phased-array signal processing computer.

FIG. 8 shows a flow chart of a beam formation process 106 performed by phased-array signal processing computer 26 (FIG. 2). Process 106 processes beamlet information signals 24 to generate beam formation data 60 (FIGS. 4-5). Process 106 performs a task 108 to get additional beam configuration data. Next, in a task 110 process 106 uses conventional and well known equations to calculate beam formation phase offset values 60' (FIG. 4) and beam formation amplitude offset values 60"(FIG. 4) in accordance with the beam formation requirements established by signals 24. Task 110 is performed for each element 12 and direct modulator 30 of antenna 10.

Following task 110, a task 112 places the beam formation data 60 obtained from task 110 into data stream 28 for delivery to the respective direct modulators 30. Task 112 routes data 60 to an appropriate bus 32 (FIG. 2), associates an appropriate element address 68 (FIG. 4) or associates appropriate frame time slot timing with each pair of beam formation phase and amplitude values 60' and 60". Next, a query task 114 is performed to insure synchronization with frames 58 (FIGS. 4–5). When the next frame 58 occurs, program flow returns to task 108 to calculate another set of beam formation data 60 for all elements 12 and direct modulators 30.

In summary, the present invention provides an improved transmitter system and method of operation. A preferred embodiment uses a digital baseband input signal. This digital baseband input signal is directly adjusted with offset values in direct modulators to digitally perform antenna beamforming. A signal processing computer distributes digital data to numerous direct modulators that are associated with numerous antenna elements, wherein beamforming and modulation simultaneously occur in a distributed fashion across the numerous direct modulators.

Although the preferred embodiments of the invention have been illustrated and described in detail, it will be readily apparent to those skilled in the art that various modifications may be made therein without departing from the spirit of the invention or from the scope of the following claims. For example, while a transmitter is discussed above, nothing prevents a receiver from being used in conjunction with the above-described transmitter, and such a receiver may use the same or a different antenna. These and other changes and modifications which are obvious to those skilled in the art are intended to be included within the scope of the present invention.

What is claimed is:

1. A transmitter system for transmitting a communication signal through an antenna array, said system comprising:
   a signal processing computer configured to receive an input signal and to generate a data stream that conveys phase and amplitude values which are responsive to said input signal, wherein said signal processing computer is configured so that said phase values describe phase point phase modulation values and beam formation phase offset values;
   a plurality of direct modulators, wherein each of said direct modulators is adapted to receive a radio frequency (RF) carrier signal, is coupled to said signal processing computer to receive said data stream, and generates a communication signal component that exhibits a frequency substantially equivalent to a frequency of said RF carrier signal, a phase which is responsive to said phase values, and an amplitude which is responsive to said amplitude values; and
   a plurality of antenna elements arranged so that each direct modulator couples to one of said antenna elements and so that said communication signal components generated by said direct modulators are simultaneously transmitted from said antenna elements and collectively form said communication signal.

2. A transmitter system as claimed in claim 1 wherein said signal processing computer is further configured so that said amplitude values describe phase point amplitude modulation values and beam formation amplitude offset values.

3. A transmitter system as claimed in claim 1 wherein
   said signal processing computer is configured so that, for each of said direct modulators, said phase point phase modulation values are updated more frequently than said beam formation phase offset values.

4. A transmitter system as claimed in claim 1 wherein said direct modulators and said signal processing computer are mutually configured so that each direct modulator is responsive to substantially all of said phase point phase modulation values generated by said signal processing computer and to only a portion of said beam formation phase offset values.

5. A transmitter system as claimed in claim 1 wherein said direct modulators and said signal processing computer are mutually configured so that different direct modulators receive different beam formation phase offset values.

6. A transmitter system as claimed in claim 1 wherein said signal processing computer is further configured to receive a plurality of input signals corresponding to a plurality of channels and to compute said phase point phase modulation values in response to each of said plurality of input signals.

7. A transmitter system as claimed in claim 6 wherein:
   said input signals are digital signals which supply user data bits;
   said apparatus transmits said communication signal over a stream of unit intervals in which a predetermined number of said user data bits from each of said input signals is transmitted during each unit interval in said stream of unit intervals;
   for each of said input signals, said signal processing computer is configured to translate, during one of said unit intervals, said predetermined number of said user input bits into phase point data; and
   said signal processing computer is further configured to combine, during one of said unit intervals, said phase point data translated from all of said input signals into an aggregate phase point, said aggregate phase point describing said phase point phase modulation value and a phase point amplitude modulation value.

8. A transmitter system for transmitting a communication signal through an antenna array, said system comprising:
   a signal processing computer configured to receive an input signal and to generate a data stream that conveys phase and amplitude values which are responsive to said input signal;
   a plurality of direct modulators, wherein each of said direct modulators is adapted to receive a radio frequency (RF) carrier signal, is coupled to said signal processing computer to receive said data stream, and generates a communication signal component that exhibits a frequency substantially equivalent to a frequency of said RF carrier signal, a phase which is responsive to said phase values, and an amplitude which is responsive to said amplitude values, said direct modulators further comprising:
      a first register adapted to receive said data stream and configured to hold beam formation phase offset values;
      a second register adapted to receive said data stream and configured to hold phase point phase modulation values;

a combination circuit coupled to said first and second registers and configured to generate a stream of element-specific phase values; and a modulator configured to modulate a phase parameter of said RF carrier signal in response to said stream of element-specific phase values; and a plurality of antenna elements arranged so that each direct modulator couples to one of said antenna elements and so that said communication signal components generated by said direct modulators are simultaneously transmitted from said antenna elements and collectively form said communication signal.

9. A transmitter system as claimed in claim 8 wherein said modulator is an amplitude-phase modulator which modulates an amplitude parameter of said RF carrier in response to a stream of element-specific amplitude values, and each of said direct modulators additionally comprises:

a third register adapted to receive said data stream and configured to hold beam formation amplitude offset values;

a fourth register adapted to receive said data stream and configured to hold phase point amplitude modulation values; and a combination circuit coupled to said third and fourth registers and configured to generate said stream of element-specific amplitude values.

10. A transmitter system as claimed in claim 8 wherein each of said direct modulators additionally comprises a frame controller adapted to receive said data stream and being coupled to said first register, said frame controller being configured to identify occurrences of said beam formation phase offset values in said data stream.

11. A method of transmitting a communication signal through an antenna array, said method comprising the steps of:

generating a data stream that conveys phase and amplitude values, said data stream being responsive to an input signal, wherein said generating step comprises the step of configuring said phase values to describe phase point phase modulation values and beam formation phase offset values;

routing said data stream to each of a plurality of direct modulators;

routing an RF carrier signal to each of said direct modulators;

independently modulating said RF carrier signal at each of said direct modulators so that each direct modulator generates a communication signal component that exhibits a frequency substantially equivalent to a frequency of said RF carrier signal, a phase which is responsive to said phase values, and an amplitude which is responsive to said amplitude values; and radiating said communication signal components generated by said direct modulators to collectively form said communication signal.

12. A method as claimed in claim 11 wherein said generating step comprises the step of configuring said amplitude values to describe phase point amplitude modulation values and beam formation amplitude offset values.

13. A method as claimed in claim 11 wherein:

each direct modulator is responsive to substantially all of said phase point phase modulation values and to only a portion of said beam formation phase offset values; and different direct modulators receive different beam formation phase offset values.

14. A method as claimed in claim 11 wherein said generating step comprises the step of processing a plurality of input signals so that said phase point phase modulation values are computed in response to each of said plurality of input signals.

15. A method as claimed in claim 14 wherein:

said input signals are digital signals which supply user data bits;

said method transmits said communication signal over a stream of unit intervals in which a predetermined number of said user data bits from each of said input signals is transmitted during each unit interval in said stream of unit intervals;

said generating step comprises the step of translating, for each of said input signals, said predetermined number of said user input bits into phase point data, said translating step occurring during one of said unit intervals; and said generating step further comprises the step of combining, during one of said unit intervals, said phase point data translated from all of said input signals into an aggregate phase point, said aggregate phase point describing said phase point phase modulation value and a phase point amplitude modulation value.

16. A method of transmitting a communication signal through an antenna array, said method comprising the steps of:

generating a data stream that conveys phase and amplitude values, said data stream being responsive to an input signal;

routing said data stream to each of a plurality of direct modulators;

routing an RF carrier signal to each of said direct modulators;

independently modulating said RF carrier signal at each of said direct modulators so that each direct modulator generates a communication signal component that exhibits a frequency substantially equivalent to a frequency of said RF carrier signal, a phase which is responsive to said phase values, and an amplitude which is responsive to said amplitude values, wherein said independently modulating step further comprises, for each of said direct modulators, the steps of:

obtaining beam formation phase offset values from said phase values of said data stream;

obtaining phase point phase modulation values from said phase values of said data stream;

combining said beam formation phase offset values and said phase point phase modulation values to generate a stream of element-specific phase values; and varying a phase parameter of said RF carrier signal in response to said stream of element-specific phase values; and radiating said communication signal components generated by said direct modulators to collectively form said communication signal.

17. A transmitter system for transmitting a communication signal through an antenna array, said system comprising:

a signal processing computer configured to receive a plurality of input signals and to generate a data stream that conveys phase point phase modulation values, beam formation phase offset values, phase point amplitude modulation values, and beam formation amplitude offset values that are collectively responsive to said input signals;

a plurality of direct modulators each of which are coupled to said signal processing computer and each of which comprises:
  a first register configured to hold a portion of said beam formation phase offset values, a second register configured to hold said phase point phase modulation values, a third register configured to hold a portion of said beam formation amplitude offset values, and a fourth register configured to hold said phase point amplitude modulation values,
  a phase combination circuit coupled to said first and second registers and configured to generate a stream of element-specific phase values, and an amplitude combination circuit coupled to said third and fourth registers and configured to generate a stream of element-specific amplitude values, and
  a modulator configured to generate a communication signal component by receiving an RF carrier signal, modulating a phase parameter of said RF carrier signal in response to said stream of element-specific phase values and modulating an amplitude parameter of said RF carrier signal in response to said stream of element-specific amplitude values; and
a plurality of antenna elements arranged so that each direct modulator couples to one of said antenna elements and so that said communication signal components generated by said direct modulators are simultaneously transmitted from said antenna elements and collectively form said communication signal.

18. A transmitter system as claimed in claim 17 wherein:

said input signals are digital signals which supply user data bits;

said apparatus transmits said communication signal over a stream of unit intervals in which a predetermined number of said user data bits from each of said input signals is transmitted during each unit interval in said stream of unit intervals;

for each of said input signals, said signal processing computer is configured to translate, during one of said unit intervals, said predetermined number of said user input bits into phase point data; and said signal processing computer is further configured to combine, during one of said unit intervals, said phase point data translated from all of said input signals into an aggregate phase point, said aggregate phase point describing one of said phase point phase modulation values and one of said phase point amplitude modulation values.

* * * * *